United States Patent
Jiang et al.

(10) Patent No.: US 6,642,070 B2
(45) Date of Patent: Nov. 4, 2003

(54) ELECTRICALLY PUMPED LONG-WAVELENGTH VCSEL AND METHODS OF FABRICATION

(76) Inventors: Wenbin Jiang, 2860 Blazing Star Dr., Thousand Oaks, CA (US) 91362; Julian Cheng, 1463 Montego Dr., San Jose, CA (US) 95120; Chan-Long Shieh, 6739 E. Bar Z La., Paradise Valley, AZ (US) 85253; Hsing-Chung Lee, 23246 Park Ensenada, Calabasas, CA (US) 91302

( * ) Notice: Subject to any disclaimer, the term of this patent is extended or adjusted under 35 U.S.C. 154(b) by 0 days.

(21) Appl. No.: 10/280,521

(22) Filed: Oct. 25, 2002

(65) Prior Publication Data

US 2003/0157739 A1 Aug. 21, 2003

Related U.S. Application Data

(62) Division of application No. 10/026,846, filed on Dec. 18, 2001, now Pat. No. 6,489,175.

(51) Int. Cl.[7] .............................................. H01L 21/20
(52) U.S. Cl. ........................... 438/22; 438/46; 438/483
(58) Field of Search .............................. 438/22, 39, 40, 438/41, 45, 46, 47, 478, 479, 483, 492, 503, 507

(56) References Cited

U.S. PATENT DOCUMENTS

| | | | | |
|---|---|---|---|---|
| 5,742,630 A | * | 4/1998 | Jiang et al. ................ | 372/45 |
| 5,805,624 A | * | 9/1998 | Yang et al. ................ | 372/45 |
| 5,838,705 A | * | 11/1998 | Shieeh et al. ............. | 372/45 |
| 6,023,485 A | * | 2/2000 | Claisse et al. ............ | 372/46 |
| 6,046,096 A | * | 4/2000 | Ouchi ....................... | 438/510 |
| 6,185,240 B1 | * | 2/2001 | Jiang et al. ............... | 372/50 |
| 6,393,038 B1 | * | 5/2002 | Raymond et al. ......... | 372/22 |
| 2001/0050934 A1 | * | 12/2001 | Choquette et al. ....... | 372/43 |
| 2003/0006429 A1 | * | 1/2003 | Takahashi et al. ........ | 257/200 |

OTHER PUBLICATIONS

Jackson et al, OC–48 capable InGaASN Vertical Cavity Lasers, Electronic Letters Mar. 15, 2001 vol. 37 No. 6pp–355–356.*
Steinle et al, Novel Monolithic VCSEL Devices for Datacom Applications, 2001 Electronic Componenets and Technology Conference.*
Klem et al, 1.3 um InGaAsN qunaum well vertical cavity surface emitting lasers on GaAs substrates, 13 th annual meetting IEEE laser and electro–Optics society 2000 annual meeting p 127–8 vol. 1.*

* cited by examiner

Primary Examiner—Savitri Mulpuri
(74) Attorney, Agent, or Firm—Parsons & Goltry; Robert A. Parsons; Michael W. Goltry

(57) ABSTRACT

A method of fabricating a vertical cavity surface emitting laser comprising the steps of epitaxially growing a first DBR positioned on a substrate wherein the first DBR is epitaxially grown using MOCVD. The substrate is orientated in an off-axis crystallographic direction which increases the radiative efficiency. A first cladding layer is positioned on the first DBR and an active region is epitaxially grown on the first cladding layer wherein the active region is epitaxially grown using plasma assisted MBE. A second DBR is epitaxially grown on the second cladding layer wherein the second DBR is epitaxially grown using MOCVD. The active region is epitaxially grown using plasma assisted MBE to increase the mole fraction of nitrogen (N) incorporation. The DBR's are grown using MOCVD to improve the electrical performance.

20 Claims, 1 Drawing Sheet

ELECTRICALLY PUMPED LONG-WAVELENGTH VCSEL AND METHODS OF FABRICATION

This application is a division of application Ser. No. 10/026,846 filed Dec. 18, 2001 now U.S. Pat. No. 6,489,175.

FIELD OF THE INVENTION

This invention relates to lasers.

More particularly, the present invention relates to lasers that generate relatively long wavelengths.

BACKGROUND OF THE INVENTION

Vertical cavity surface emitting lasers (hereinafter referred to as "VSCEL's") include first and second distributed Bragg reflectors (hereinafter referred to as "DBR's") formed on opposite sides of an active area. The VCSEL can be driven or pumped electrically by forcing current through the active area or optically by supplying light of a desired frequency to the active area. Typically, DBR's or mirror stacks are formed of a material system generally consisting of two materials having different indices of refraction and being easily lattice matched to the other portions of the VCSEL. In conventional VCSEL's, conventional material systems perform adequately.

However, new products are being developed requiring VCSEL's which emit light having a long wavelength. The indium gallium arsenic nitride (herein after referred to as "InGaAsN") material system can be used to fabricate light sources that have been shown to emit at wavelengths near 1300 nm, and up to 1500 nm for some edge emitting devices. These wavelengths are important for fiber optic communication systems. The InGaAsN material system can be closely lattice matched to gallium arsenide (hereinafter referred to as "GaAs") and, therefore, can be epitaxially grown on a GaAs substrate. This feature is significant because gallium arsenide/aluminum arsenide (GaAs/AlAs) DBR materials can then be used to form the highly reflective mirrors of a 1300 nm long wavelength vertical cavity surface emitting laser (hereinafter referred to as "VCSEL") with InGaAsN or InGaAsN grown with the addition of antimony (Sb) (hereinafter referred to as "InGaAsN:Sb") quantum wells as the active gain medium.

However, a problem encountered in making long wavelength VCSEL's based on the InGaAsN material system is the difficulty of incorporating a sufficient mole fraction of nitrogen into the lattice of the grown epilayers in order to reduce the bandgap for long wavelength operation. The nitrogen incorporation can be improved by reducing the epitaxial growth temperature for both plasma assisted molecular beam epitaxy (hereinafter referred to as "MBE") and metalorganic chemical vapor phase deposition (hereinafter referred to as "MOCVD"), with a resultant degradation in material quality and photoluminescence intensity. Also, the nitrogen mole fraction can also be increased much more substantially by introducing a plasma source in an ultra-high vacuum plasma assisted MBE chamber to produce more nitrogen radicals.

It would be highly advantageous, therefore, to remedy the foregoing and other deficiencies inherent in the prior art.

Accordingly, it is an object of the present invention to provide a new and improved method of fabricating an electrically pumped long wavelength vertical cavity surface emitting laser.

It is an object of the present invention to provide a new and improved method of fabricating an electrically pumped long wavelength vertical cavity surface emitting laser which incorporates more nitrogen into the active region.

It is another object of the present invention to provide a new and improved method of fabricating an electrically pumped long wavelength vertical cavity surface emitting laser which has an improved radiation efficiency.

It is still another object of the present invention to provide a new and improved method of fabricating an electrically pumped long wavelength vertical cavity surface emitting laser which has high quality distributed Bragg reflector mirrors.

It is still another object of the present invention to provide a new and improved electrically pumped long wavelength vertical cavity surface emitting laser which can be fabricated with a higher growth rate.

It is a further object of the present invention to provide a new and improved electrically pumped long wavelength vertical cavity surface emitting laser which has distributed Bragg reflectors that have continuously graded heterointerfaces.

SUMMARY OF THE INVENTION

To achieve the objects and advantages specified above and others, a method of fabricating an electrically pumped long wavelength vertical cavity surface emitting laser is disclosed. The method includes epitaxially growing a distributed Bragg reflector positioned on a compatible substrate wherein the distributed Bragg reflector is epitaxially grown using MOCVD. A GaAs cladding layer is epitaxially grown on the distributed Bragg reflector and an active region is epitaxially grown on the cladding layer wherein the active region is epitaxially grown using plasma assisted MBE. A cladding layer is epitaxially grown on the active region and a distributed Bragg reflector is epitaxially grown on the cladding layer wherein the distributed Bragg reflector is epitaxially grown using MOCVD.

In the preferred embodiment, the substrate includes GaAs and is oriented in the (100), (111), (211), (311), (411), or another off-axis crystallographic direction. By orienting the substrate off-axis, the radiation efficiency is improved. Also, the light emission can be confined to a desired region by using lateral oxidation or proton implantation. Further, the light emission can be confined to a desired region by forming a mesa in the distributed Bragg reflector.

One reason MOCVD is used to epitaxially grown the distributed Bragg reflectors is because it is easier to control the doping and the interfacial compositional grading. Also, the growth rate using MOCVD is faster than plasma assisted MBE which is important because DBR's are relatively thick.

One reason plasma assisted MBE is used to epitaxially grow the active region is because it is easier to incorporate nitrogen into the semiconductor layers to reduce the bandgap for long wavelength operation. Thus, the method of fabricating the electrically pumped long wavelength vertical cavity surface emitting laser combines the advantages of both the plasma assisted MBE and MOCVD growth techniques.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which the single FIGURE is a sectional view of a vertical cavity surface emitting laser in accordance with the present invention.

DETAILED DESCRIPTION OF THE PREFERRED EMBODIMENT

Figure 1:
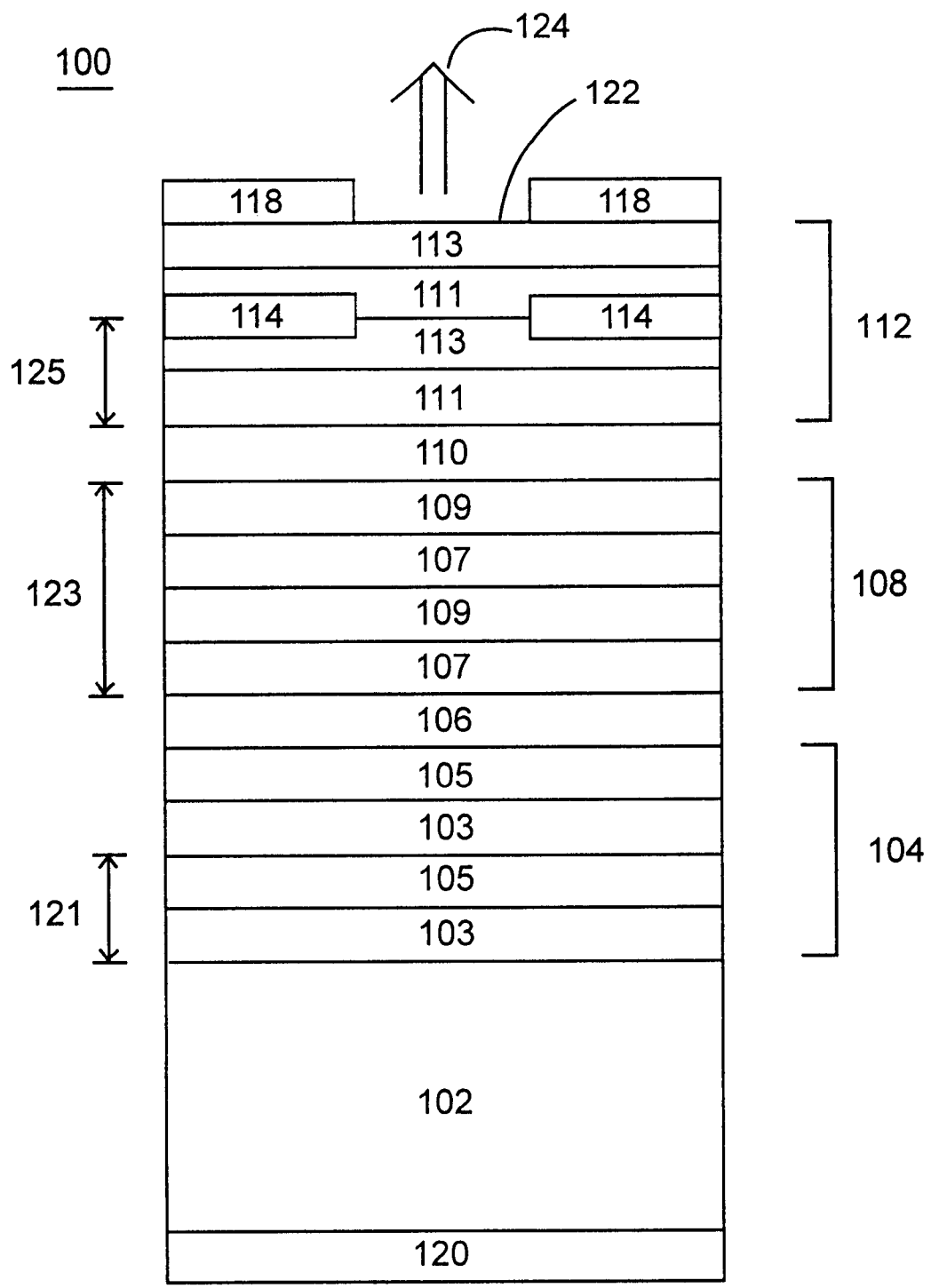

Turn now to the FIGURE which illustrates an electrically pumped long wavelength vertical cavity surface emitting laser 100 in accordance with the present invention. It will be understood that while we are illustrating a single VCSEL that generally a plurality of VCSEL's are deposited or grown in blanket layers over an entire wafer so that a large number of VCSEL's are fabricated simultaneously. A substrate 102 is provided which may be, for example, a semiconductor wafer or the like. In the preferred embodiment, substrate 102 includes n-type doped GaAs and is orientated in a crystallographic direction such as the (100), (111), (211), (311), (411), or another off-axis crystallographic direction. However, it will be understood that other material systems may be appropriate where it is desired to emit light at a different wavelength. Further, by using an off-axis crystallographic direction, the radiation efficiency is substantially improved.

A DBR region 104 is positioned on substrate 102 wherein DBR region 104 is epitaxially grown using a MOCVD system. In the preferred embodiment, DBR region 104 is n-type doped and includes a plurality of AlGaAs layers 103 wherein a GaAs layer 105 is sandwiched therebetween each adjacent AlGaAs layer 103. It will be understood that layer 105 can include other materials, such as AlGaAs alloyed with a different composition compared to AlGaAs layer 103. Further, each pair of layers 103 and 105 in DBR region 104 has a thickness 121 of a quarter-wavelength. In addition, the layers in DBR region 104 are lattice matched to substrate 102.

A GaAs cladding layer 106 is then epitaxially grown in the MOCVD system on DBR region 104. GaAs cladding layer 106 can also act as a protective cap to minimize contamination when electrically pumped long wavelength VCSEL 100 is transferred from the MOCVD system to a MBE system, as will be discussed presently.

Once the transfer to the MBE system is made, an active region 108 is epitaxially grown on GaAs cladding layer 106. It will be understood that the there are many different types of MBE systems that can be used. In the preferred embodiment, a plasma assisted MBE system is used to increase the number of nitrogen radicals. In some embodiments, part of GaAs cladding layer 106 may be removed after transfer to the plasma assisted MBE system to ensure that further layers are grown on a pristine surface. In the preferred embodiment, active region 108 includes a plurality of barrier layers 109 having sandwiched therebetween a quantum well layer 107 wherein the quantum well layers include InGaAsN. It will be understood that the quantum well layers can be grown with the addition of various elements, such as antimony (Sb) or other suitable materials to improve the quality of the quantum well structures. In the preferred embodiment, barrier layers 109 include GaAs, but it will be understood that other materials could be used, such as tensile strained GaAsP, GaAsN, or Ga(Al)AsN. Also, in the preferred embodiment, quantum well layers 107 can include alloys of the InGaAsN material system, but other material systems may be appropriate.

Generally active region 108 includes one or more quantum structures, such as quantum dots, quantum wires, or quantum wells, with barrier layers sandwiched therebetween. As is understood by those skilled in the art, active region 108 is formed with a thickness 123 equal to approximately an integer multiple of one wavelength of the emitted light. A GaAs cladding layer 110 is then epitaxially grown in the plasma assisted MBE system on active region 108. GaAs cladding layer 110 can also act as a protective cap to minimize contamination when electrically pumped long wavelength VCSEL 100 is transferred from the plasma assisted MBE system to the MOCVD system.

Cladding layers 106 and 110 are included to provide carrier confinement and phase matching and to this end they generally have higher bandgaps than active region 108. Here it will be understood that, while cladding layers 106 and 110 are illustrated and referred to as single layers, either or both can include multiple layers in various embodiments and for varying purposes. Further, it is well-known to those skilled in the art that cladding layers 106 and 110 can also serve as doped intra-cavity contacting layers for electrical current injection.

One reason plasma assisted MBE is used to grow active region 108 is because it is easier to incorporate nitrogen into the semiconductor layers to reduce the bandgap for long wavelength operation. Further, nitrogen incorporation can be improved by introducing a plasma source in the plasma assisted MBE system to produce more nitrogen radicals. Also, the plasma assisted MBE system does not require any doping source and, therefore, the purity of the growth chamber is preserved which improves the quality of the epitaxial material.

Once electrically pumped long wavelength VCSEL 100 is transferred from the plasma assisted MBE system back to the MOCVD system, a DBR region 112 is epitaxially grown on GaAs cladding layer 110. In the preferred embodiment, DBR region 112 is p-type doped and includes a plurality of GaAs layer 113 having sandwiched therebetween AlGaAs layers 111. Further, each pair of layers 111 and 113 in DBR region 112 has a thickness 125 approximately equal to a quarter-wavelength.

A carrier confinement region 114 is formed within DBR region 112. Carrier confinement region 114 can include a proton implant or the lateral oxidation of AlGaAs. Further, in the preferred embodiment, a top metal contact 118 is deposited on DBR region 112 and a bottom metal contact 120 is deposited on substrate 102. Top metal contact 118 is patterned or etched to form a VCSEL emission aperture 122. Carrier confinement region 114 is formed and aligned to allow light emission through DBR region 112 and VCSEL emission aperture 122, as illustrated in the FIGURE. To further enhance light emission, DBR region 112 can include a mesa to increase the carrier confinement.

While the steps of the fabrication method have been described, and will be claimed, in a specific order, it will be clear to those skilled in the art that various steps and procedures may be performed in a different order. It is intended, therefore, that the specific order described or claimed for the various fabrication steps does not in any way limit the invention and any variations in order that still come within the scope of the invention are intended to be covered in the claims.

Also, it will be understood that the radiation efficiency of electronically pumped long wavelength vertical cavity surface emitting laser 100 can be substantially improved by orienting substrate 102 in an off-axis crystallographic direction, such as the (100), (111), (211), (311), (411) or another suitable off-axis crystallographic direction, wherein the subsequent layers grown thereon are grown using either a MBE system or a MOCVD system.

One reason MOCVD is used to epitaxially grow the first and second DBR's is because it is easier to control the doping. Further, using MOCVD it is easier to grow high quality DBR's with continuously graded heterointerfaces. Also, the growth rate using MOCVD is faster than plasma assisted MBE which is important because DBR's need to be relatively thick at long wavelengths and it is highly desirable to decrease the growth time.

Thus, a new method for fabricating a long wavelength VCSEL uses a hybrid mixture of epitaxial growth approaches that combine the advantages of both plasma assisted MBE and MOCVD. The active region is epitaxially grown with plasma assisted MBE and the DBR mirrors are grown using MOCVD. Further, the radiative efficiency is substantially improved by epitaxially growing the long wavelength VCSEL on an off-axis substrate, which also improves the power performance and polarization control. The hybrid epitaxial growth method is a highly manufacturable and cost effective all-epitaxial process. The plasma assisted MBE growth does not require any doping source, thus preserving the purity of the growth chamber and improving the quality of the epitaxial material. Further, MOCVD is best equipped for DBR growth due to the ease of interfacial compositional grading and doping control, as well as its greater efficiency in growing the thicker DBR epilayer structures required for long wavelength VCSELS.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating a vertical cavity surface emitting laser comprising the steps of:
   providing a GaAs substrate oriented in one of the (211), (311), (411), and another off-axis crystallographic direction to improve the radiation efficiency of the vertical cavity surface emitting laser;
   epitaxially growing a first distributed Bragg reflector positioned on the GaAs substrate including a plurality of GaAs layers wherein each GaAs layer is sandwiched therebetween layers of an AlGaAs alloy and wherein the first distributed Bragg reflector is grown using Metalorganic Chemical Vapor Phase Epitaxy;
   epitaxially growing a first cladding layer positioned on the first distributed Bragg reflector;
   epitaxially growing an active region which is capable of emitting light, the active region having a thickness equal to approximately an integer multiple of one wavelength and is positioned on the first cladding layer wherein the active region include a plurality of quantum structures which includes at least one InGaAsN alloy layer and wherein the active region is grown using plasma assisted Molecular Beam Epitaxy;
   epitaxially growing a second cladding layer positioned on the active region; and
   epitaxially growing a second distributed Bragg reflector positioned on the second cladding layer including a plurality of GaAs layers wherein each GaAs layer is sandwiched therebetween layers of a AlGaAs alloy and wherein the second distributed Bragg reflector is grown using Metalorganic Chemical Vapor Phase Epitaxy.

2. A method of fabricating a vertical cavity surface emitting laser as claimed in claim 1, wherein the first distributed Bragg reflector is n-type doped and the second distributed Bragg reflector is p-type doped.

3. A method of fabricating a vertical cavity surface emitting laser as claimed in claim 1, wherein the first distributed Bragg reflector is p-type doped and the second distributed Bragg reflector is n-type doped.

4. A method of fabricating a vertical cavity surface emitting laser as claimed in claim 1, wherein protons are implanted to a depth within the second distribution Bragg reflector to produce a highly resistive implanted region that provides carrier confinement.

5. A method of fabricating a vertical cavity surface emitting laser as claimed in claim 1 wherein a mesa is formed in the second Bragg reflector to provide carrier confinement.

6. A method of fabricating a vertical cavity surface emitting laser as claimed in claim 1 wherein portions of one or more layers in the second Bragg reflector mirror are laterally oxidized to provide carrier confinement.

7. A method of fabricating a vertical cavity surface emitting laser as claimed in claim 1 including in addition the step of depositing a p-metal contact layer onto a portion of the second distributed Bragg reflector leaving an optical aperture for the emitted light to exit and depositing a n-metal contact layer on the back side of the GaAs substrate.

8. A method of fabricating a vertical cavity surface emitting laser as claimed in claim 1 wherein the plurality of quantum barrier layers in the active region includes one of GaAs, GaAsN, GaAsP, Ga(Al)AsN, and another suitable material with a bandgap larger than the bandgap of the quantum structures.

9. A method of fabricating a vertical cavity surface emitting laser as claimed in claim 1 wherein at least one layer in the active region includes one of antimony (Sb) and another suitable material to improve the quality of the quantum well structures.

10. A method of fabricating a vertical cavity surface emitting laser comprising the steps of:
    providing a substrate oriented in off-axis crystallographic direction;
    epitaxially growing a first distributed Bragg reflector positioned on the substrate wherein the first distributed Bragg reflector is doped p-type and includes a plurality of GaAs/AlGaAs layers which are grown using Metalorganic Chemical Vapor Phase Epitaxy;
    epitaxially growing a first cladding layer positioned on the first distributed Bragg reflector;
    epitaxially growing an active region capable of emitting light, the active region having a thickness equal to approximately an integer multiple of one wavelength positioned on the first cladding layer wherein the active region is doped n-type and includes a plurality of quantum structures with a bandgap which includes at least one layer of an InGaAsN alloy sandwiched therebetween a plurality of barrier layers and wherein the active region is grown using plasma assisted Molecular Beam Epitaxy;
    epitaxially growing a second cladding layer positioned on the active region; and
    epitaxially growing a second distributed Bragg reflector positioned on the second cladding layer wherein the second distributed Bragg reflector includes a plurality of GaAs/AlGaAs layers which are grown using Metalorganic Chemical Vapor Phase Epitaxy.

11. A method of fabricating a vertical cavity surface emitting laser as claimed in claim 10 wherein the plurality of barrier layers includes one of GaAs and another suitable material.

12. A method of fabricating a vertical cavity surface emitting layer as claimed in claim 10 wherein the substrate includes one of GaAs and another suitable material.

13. A method of fabricating a vertical cavity surface emitting laser as claimed in claim 9 wherein protons are implanted to a depth within the second distributed Bragg reflector to produce a highly resistive implanted region that provides carrier confinement.

14. A method of fabricating a vertical cavity surface emitting laser as claimed in claim 10 wherein a mesa is formed in the second Bragg reflector to provide carrier confinement.

15. A method of fabricating a vertical cavity surface emitting laser as claimed in claim 9 wherein portions of one or more layers in the second Bragg reflector mirror are laterally oxidized to provide carrier confinement.

16. A method of fabricating a vertical cavity surface emitting laser as claimed in claim 10 including further the step of depositing a p-metal contact layer is onto a portion of the second distributed Bragg reflector leaving an optical aperture for the emitted light to exit and depositing a n-metal contact layer is one the back side of the GaAs substrate.

17. A method of fabricating a vertical cavity surface emitting laser as claimed in claim 10 including further the step of depositing a n-metal contact layer is onto a portion of the second distributed Bragg reflector leaving an optical aperture for the emitted light to exit and depositing a p-metal contact layer is on the back side of the GaAs substrate.

18. A method of fabricating a vertical cavity surface emitting laser as claimed in claim 10 wherein the active region includes a plurality of quantum structures with a bandgap which include one of quantum wells, quantum dots, quantum wires and combinations thereof.

19. A method of fabricating a vertical cavity surface emitting laser as claimed in claim 10 wherein at least one layer in the active region includes one of antimony (Sb) and another suitable material to improve the quality of the quantum structures.

20. A method of fabricating a vertical cavity surface emitting laser as claimed in claim 10 wherein the plurality of quantum barrier layers in the active region includes one of GaAs, GaAsN, GaAsP, Ga(Al)AsN, and another suitable material with a bandgap larger than the bandgap of the quantum structures.

* * * * *